US012604507B2

(12) United States Patent
Komatsu et al.

(10) Patent No.: US 12,604,507 B2
(45) Date of Patent: Apr. 14, 2026

(54) METHOD OF MANUFACTURING SEMICONDUCTOR DEVICE

(71) Applicant: RENESAS ELECTRONICS CORPORATION, Tokyo (JP)

(72) Inventors: Futoshi Komatsu, Tokyo (JP); Tomoo Nakayama, Tokyo (JP); Katsuhiro Uchimura, Tokyo (JP); Hiroshi Inagawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 482 days.

(21) Appl. No.: 18/185,079

(22) Filed: Mar. 16, 2023

(65) Prior Publication Data

US 2023/0387219 A1     Nov. 30, 2023

(30) Foreign Application Priority Data

May 25, 2022     (JP) ................................. 2022-085268

(51) Int. Cl.
*H01L 29/40*          (2006.01)
*H01L 21/02*          (2006.01)
*H01L 21/288*         (2006.01)
*H01L 21/304*         (2006.01)
*H01L 21/56*          (2006.01)
(Continued)

(52) U.S. Cl.
CPC ....... *H10D 64/01* (2025.01); *H01L 21/02164* (2013.01); *H01L 21/0217* (2013.01); *H01L 21/02359* (2013.01); *H01L 21/288* (2013.01); *H01L 21/304* (2013.01); *H01L 21/56* (2013.01);
(Continued)

(58) Field of Classification Search
CPC ................ H10D 64/01; H10D 12/038; H10D 21/02164; H10D 21/0217; H10D 21/02359; H10D 21/288; H10D 21/304; H10D 21/56
See application file for complete search history.

(56) References Cited

U.S. PATENT DOCUMENTS 7,335,574 B2     2/2008  Okuda et al.
7,883,991 B1 *   2/2011  Wu ..................... H01L 25/0657
                                                          438/455
(Continued)

FOREIGN PATENT DOCUMENTS

JP          2001-044168 A        2/2001
JP          2003-142434 A        5/2003
(Continued)

OTHER PUBLICATIONS

Office Action dated Jul. 1, 2025, issued in corresponding Japan Patent Application No. 2022-085268, 6 pages.

*Primary Examiner* — Victor A Mandala
*Assistant Examiner* — Colleen E Snow
(74) *Attorney, Agent, or Firm* — Rimon P.C.

(57)          ABSTRACT

A method of manufacturing a semiconductor device includes: forming a silicon oxide film covering each of a first main surface and a second main surface of a semiconductor substrate; forming a redistribution wiring on the first main surface side of the semiconductor substrate; and grinding the second main surface of the semiconductor substrate. This grinding step is performed in a state in which a thickness of the silicon oxide film positioned on the second main surface is equal to or larger than 10 nm and equal to or smaller than 30 nm.

4 Claims, 11 Drawing Sheets

(51) Int. Cl.
    *H10D 12/01*         (2025.01)
    *H10D 64/01*         (2025.01)
    *H10D 64/27*         (2025.01)

(52) U.S. Cl.
    CPC ......... *H10D 12/038* (2025.01); *H10D 64/513*
                         (2025.01)

(56)                 References Cited

U.S. PATENT DOCUMENTS

| | | |
|---|---|---|
| 10,741,504 B2 | 8/2020 | Yoshida |
| 11,456,265 B2 | 9/2022 | Tonegawa |
| 2013/0029475 A1* | 1/2013 | Tsukamoto ....... H01L 21/02236 |
| | | 438/459 |
| 2021/0320201 A1* | 10/2021 | Tsai .................... H10D 64/518 |

FOREIGN PATENT DOCUMENTS

| | | |
|---|---|---|
| JP | 2005-303218 A | 10/2005 |
| JP | 2018-113307 A | 7/2018 |
| JP | 2020-120133 A | 8/2020 |

* cited by examiner

METHOD OF MANUFACTURING SEMICONDUCTOR DEVICE

CROSS-REFERENCE TO RELATED APPLICATION

The disclosure of Japanese Patent Application No. 2022-085268 filed on May 25, 2022, including the specification, drawings and abstract is incorporated herein by reference in its entirety.

BACKGROUND

The present invention relates to a method of manufacturing a semiconductor device, and, more particularly relates to a technique effectively applied to a method of manufacturing a semiconductor device by performing a plating method to form a redistribution wiring on a semiconductor substrate, and then, grinding a back surface of the semiconductor substrate.

There is disclosed a technique listed below.

[Patent Document 1] Japanese Unexamined Patent Application Publication No. 2018-113307

After formation of a wiring layer on a semiconductor wafer, a redistribution wiring is formed on the wiring layer by using a plating method in some cases. Patent Document 1 describes a method of grinding a back surface of a semiconductor wafer while leaving an outer circumferential portion of the semiconductor wafer as a technique for thinning the semiconductor wafer.

SUMMARY

In a semiconductor wafer having a diameter that is larger than 8 inches, a back surface of a semiconductor substrate is a mirror surface in order to secure flatness of the semiconductor wafer and others. Even if the back surface is oxidized in a manufacturing step of a semiconductor element, the back surface remains to be the mirror surface (smooth surface). If the back-surface grinding step is performed in this state, rotation of a grind blade stops soon, and the grinding may not be normally performed. In this case, increase in a rotation speed of the grind blade in order to normally perform the grinding causes a risk of stoppage of a grinding machine due to generation of overcurrent. Therefore, reduction of reliability of the method of manufacturing the semiconductor device may be a problem.

Other objects and novel characteristics will be apparent from the description of the present specification and the accompanying drawings.

The outline of the typical aspects of the embodiments disclosed in the present application will be briefly described as follows.

A method of manufacturing a semiconductor device according to an embodiment includes: preparing a semiconductor substrate having a first main surface and a second main surface opposite to the first main surface; forming a silicon oxide film covering each of the first main surface and the second main surface; forming a wiring on the first main surface; forming a redistribution wiring on the wiring by using a plating method; and grinding the silicon oxide film positioned on the second main surface and the second main surface. The grinding the silicon oxide film and the second main surface is performed in a state in which a thickness of the silicon oxide film positioned on the second main surface is equal to or larger than 10 nm and equal to or smaller than 30 nm.

A method of manufacturing a semiconductor device according to an embodiment includes: preparing a semiconductor substrate having a first main surface and a second main surface opposite to the first main surface; forming a silicon oxide film covering each of the first main surface and the second main surface; forming a wiring on the first main surface; forming a redistribution wiring on the wiring by using a plating method; exposing the second main surface by removing the silicon oxide film positioned on the second main surface; covering the first main surface with a protection tape; grinding the second main surface; and peeling off the protection tape.

According to an embodiment, the reliability of the method of manufacturing the semiconductor device can be improved.

BRIEF DESCRIPTIONS OF THE DRAWINGS

FIG. 12 is a cross-sectional view in a manufacturing step of the semiconductor device, continued from FIG. 11.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail with reference to the accompanying drawings. Note that components having the same function are denoted by the same reference signs throughout the drawings for describing the embodiments, and the repetitive description thereof will be omitted. In addition, the description of the same or similar portions is not repeated in principle unless otherwise particularly required in the following embodiments.

First Embodiment

<Method of Manufacturing Semiconductor Device>

With reference to FIGS. 1 to 14, a method of manufacturing a semiconductor device according to the present embodiment will be explained below. FIGS. 1 to 8, 12 and 13 show an element formation region 1A and an element-isolation formation region 1B. A case of formation of an Insulated Gate Bipolar Transistor (IGBT) element in the element formation region 1A will be explained below.

Figure 1:
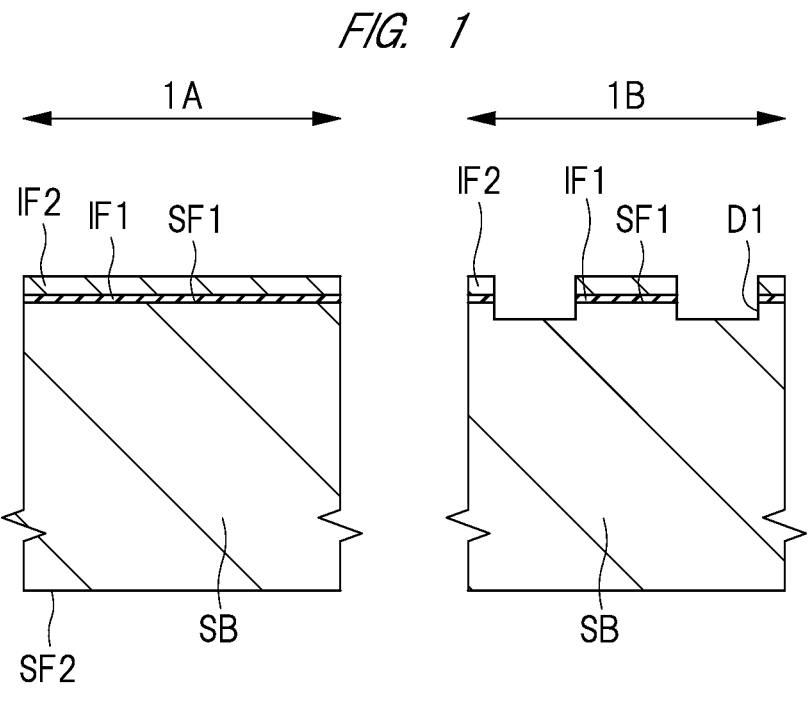
FIG. 1 is a cross-sectional view in a manufacturing step of a semiconductor device according to a first embodiment.

First, as shown in FIG. 1, a semiconductor substrate SB including a first main surface (upper surface, front surface) SF1 and a second main surface (lower surface, back surface) SF2 opposite to the first main surface SF1 is prepared. The semiconductor substrate SB is made of single crystal silicon (Si) having an n-type conductivity. The semiconductor substrate SB is a disk-shaped semiconductor wafer. The semiconductor substrate SB and a structure formed on it may be collectively referred to as semiconductor wafer below.

Subsequently, insulating films IF1 and IF2 are sequentially formed on the semiconductor substrate SB. First, the insulating film IF1 is formed on the semiconductor substrate SB. The insulating film IF1 is made of, for example, silicon oxide (SiO$_2$) formed by a thermal oxidation method. Next, the insulating film IF2 is formed on the insulating film IF1. The insulating film IF2 is made of, for example, silicon nitride (Si$_3$N$_4$) deposited by a Chemical Vapor Deposition (CVD) method. A thickness of the insulating film IF1 is, for example, 30 nm. A thickness of the insulating film IF2 is, for example, 150 nm.

Subsequently, trenches D1 are formed on the semiconductor substrate SB. The trench D1 is formed on the semiconductor substrate SB to penetrate the insulating films IF2 and IF1 in the element-isolation formation region 1B by a photolithography technique and a dry etching method. The trench D1 has a predetermined depth from the first main surface SF1 in a direction toward the second main surface SF2. Subsequently, the insulating films IF1 and IF2 covering an outer circumferential surface (side surface) of the semiconductor wafer are removed by etching although not illustrated.

Figure 2:
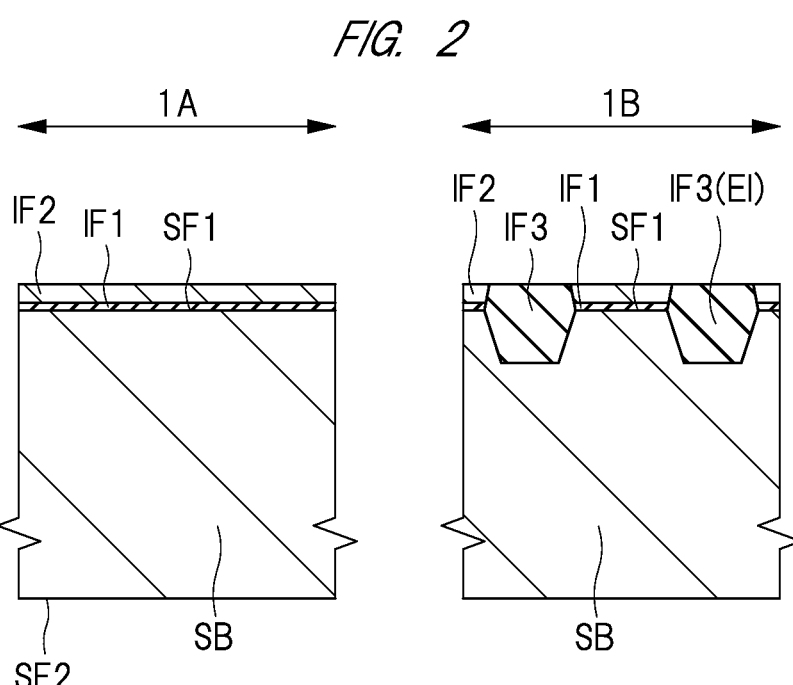
FIG. 2 is a cross-sectional view in a manufacturing step of the semiconductor device, continued from FIG. 1.

Next, as shown in FIG. 2, by a thermal oxidation method, an insulating film IF3 is formed on the first main surface SF1 of the semiconductor substrate SB exposed from the insulating films IF1 and IF2 in the element-isolation formation region 1B. In other words, the insulating film IF3 is formed inside the trench D1. In this case, the insulating film IF3 covering the outer circumferential surface (side surface) of the semiconductor wafer is also formed. The insulating film IF3 is made of a silicon oxide film. A thickness of the insulating film IF3 is, for example, equal to or larger than 300 nm. The insulating film IF3 formed in the element-isolation formation region 1B is a LOCal Oxidation of Silicon (LOCOS) oxidation film configuring an element-isolation region EI. In the element-isolation formation region 1B, note that the element-isolation region EI may be made of Shallow Trench Isolation (STI) or P-N junction isolation.

Figure 3:
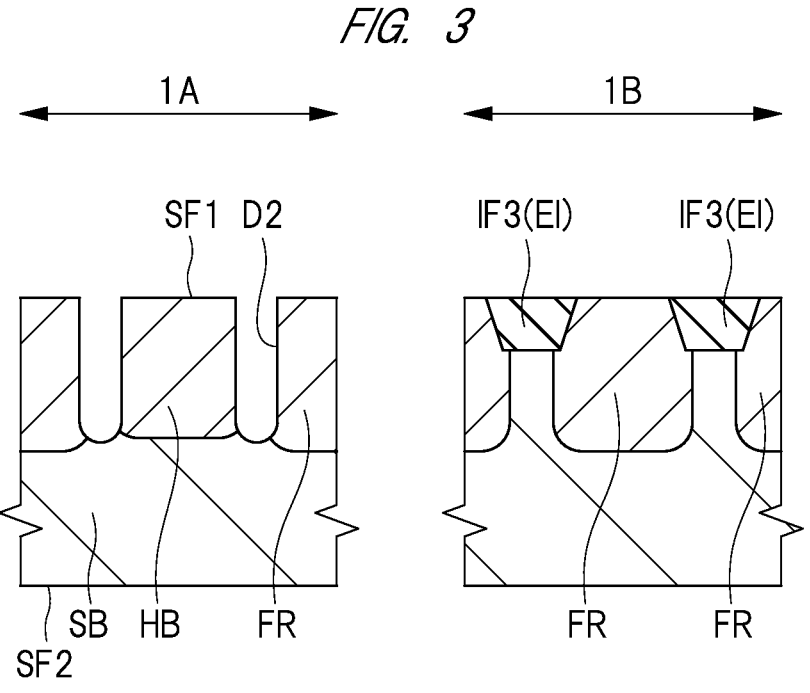
FIG. 3 is a cross-sectional view in a manufacturing step of the semiconductor device, continued from FIG. 2.

Next, as shown in FIG. 3, the insulating films IF1 and IF2 are removed by a wet etching method or others. Subsequently, the first main surface SF1 of the semiconductor substrate SB in the element formation region 1A is doped with n-type impurities (such as phosphorus (P)) by an ion implantation method. Subsequently, the first main surface SF1 of the semiconductor substrate SB is doped with p-type impurities (such as boron (B)) by an ion implantation method.

Subsequently, a plurality of trenches D2 are formed in the first main surface SF1 of the semiconductor substrate SB in the element formation region 1A by a photolithography technique and a dry etching method. The trench D2 has a predetermined depth from the first main surface SF1. Then, by a thermal process on the semiconductor substrate SB, the impurities introduced into the semiconductor substrate SB are diffused. In this manner, an n-type semiconductor region HB and a p-type semiconductor region FR are formed. Each of the semiconductor region HB and the semiconductor region FR has a predetermined depth from the first main surface SF1. The trench D2 is formed between the semiconductor region HB and the semiconductor region FR.

Figure 4:
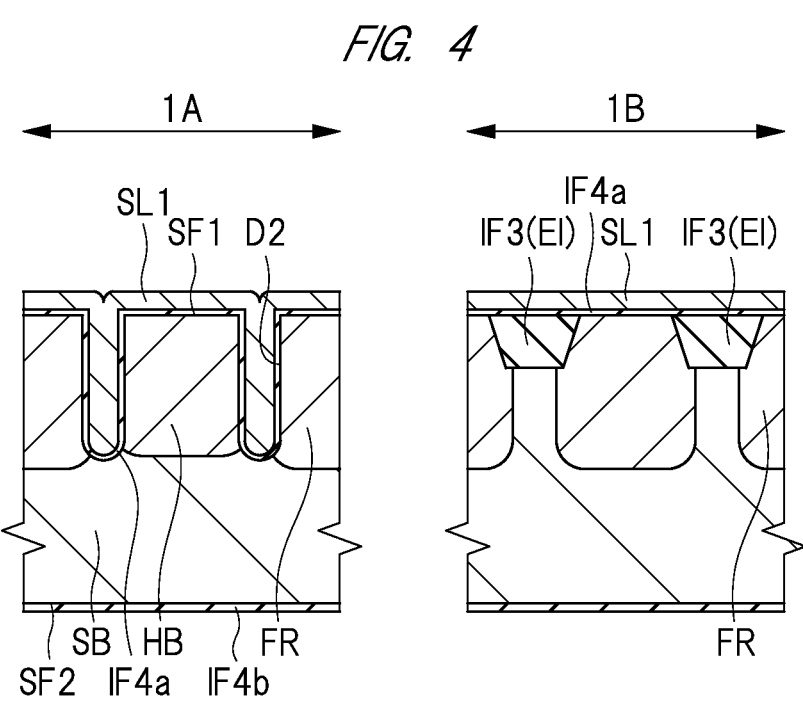
FIG. 4 is a cross-sectional view in a manufacturing step of the semiconductor device, continued from FIG. 3.

Next, as shown in FIG. 4, an insulating film IF4a covering the first main surface SF1 of the semiconductor substrate SB is formed on the first main surface SF1, and an insulating film IF4b covering the second main surface SF2 of the semiconductor substrate SB is formed on the second main surface SF2. Each of the insulating films IF4a and IF4b is made of, for example, a silicon oxide film, and has a thickness of, for example, 100 nm. The insulating films IF4a and IF4b are formed by, for example, a thermal oxidation method. The insulating film IF4a is formed on a side surface and a bottom surface inside the trench D2. In other words, the insulating film IF4a is formed on an inner surface of the trench D2 and on the first main surface SF1. The insulating film IF4b is formed on the second main surface SF2.

Subsequently, on the first main surface SF1 of the semiconductor substrate SB, a semiconductor layer SL1 made of polysilicon is formed on the insulating film IF4a. The semiconductor layer SL1 is buried in the trench D2 via the insulating film IF4a. In this case, a polysilicon film covering the second main surface SF2 of the semiconductor substrate SB is also formed via the insulating film IF4b although not illustrated.

Subsequently, the polysilicon film covering the second main surface SF2 of the semiconductor substrate SB is removed by a wet etching method using, for example, hydrofluoric-nitric acid. In this manner, the insulating film IF4*b* is exposed. By performing overetching to the polysilicon film formed on the second main surface SF2, a part of the insulating film IF4*b* formed on the second main surface SF2 is removed. In this manner, a thickness of the insulating film IF4*b* formed on the second main surface SF2 becomes, for example, roughly equal to or larger than 60 nm and equal to or smaller than 70 nm.

Figure 5:
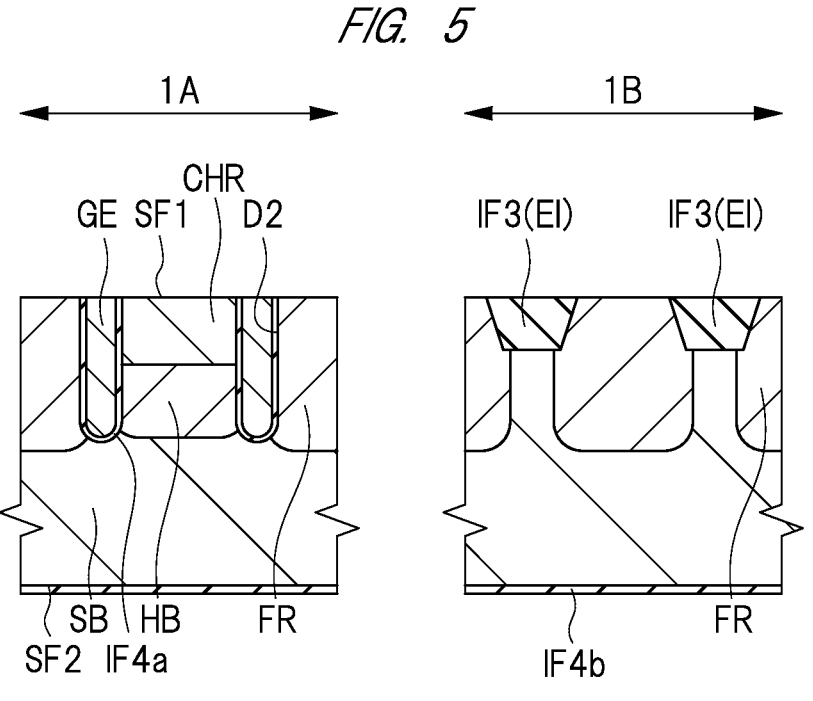
FIG. 5 is a cross-sectional view in a manufacturing step of the semiconductor device, continued from FIG. 4.

Next, as shown in FIG. 5, by performing etching to the semiconductor layer SL1, the semiconductor layer SL1 formed out of the trench D2 is removed. In this manner, the semiconductor layer SL1 remains only inside the trench D2. The semiconductor layer SL1 inside the trench D2 configures a gate electrode GE. Subsequently, by performing etching to the insulating film IF4*a*, the insulating film IF4*a* formed out of the trench D2 is removed. In this manner, the insulating film IF4*a* remains only inside the trench D2. The insulating film IF4*a* inside the trench D2 configures a gate insulating film.

Subsequently, although not illustrated, a silicon oxide film covering the first main surface SF1 and the second main surface SF2 of the semiconductor substrate SB is formed by, for example, a CVD method. In this manner, a thickness of the insulating film IF4*b* covering the second main surface SF2 of the semiconductor substrate SB becomes, for example, roughly equal to or larger than 70 nm and equal to or smaller than 80 nm. Subsequently, the first main surface SF1 of the semiconductor substrate SB in the element formation region 1A is doped with p-type impurities (such as boron (B)) by an ion implantation method. Then, by a thermal process on the semiconductor substrate SB, a p-type semiconductor region CHR is formed. The semiconductor region CHR has a predetermined depth from the first main surface SF1 of the semiconductor substrate SB. A depth of the semiconductor region CHR is shallower than a depth of the trench D2.

Subsequently, the silicon oxide film (not illustrated) covering the first main surface SF1 and the second main surface SF2 of the semiconductor substrate SB is removed by a wet etching method. In this manner, the thickness of the insulating film IF4*b* covering the second main surface SF2 of the semiconductor substrate SB becomes, for example, roughly equal to or larger than 50 nm and equal to or smaller than 60 nm.

Figure 6:
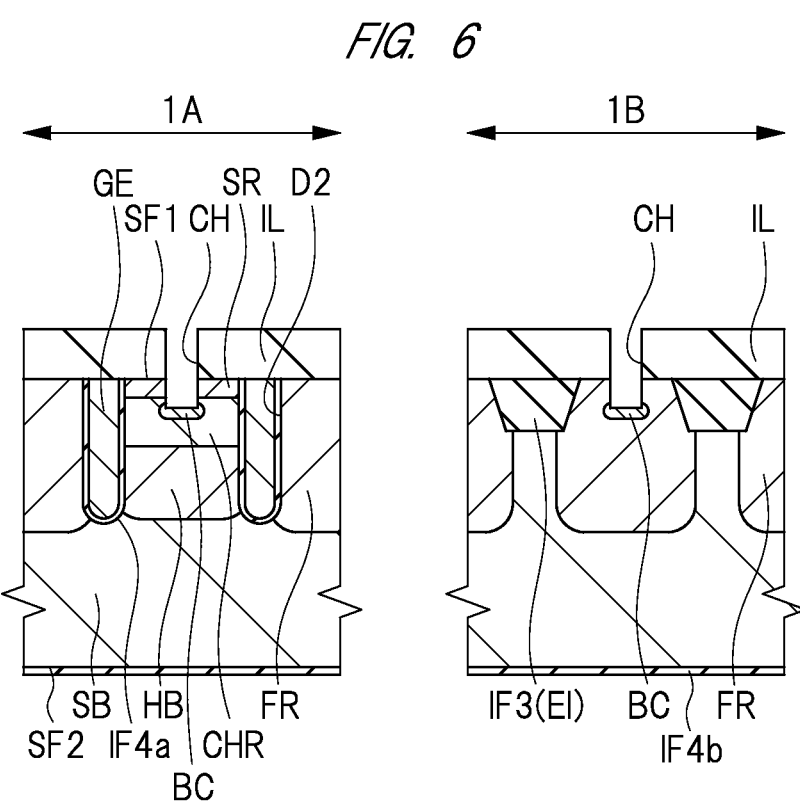
FIG. 6 is a cross-sectional view in a manufacturing step of the semiconductor device, continued from FIG.

Next, as shown in FIG. 6, the first main surface SF1 of the semiconductor substrate SB between the adjacent trenches D2 in the element formation region 1A is doped with n-type impurities (such as arsenic (As)) by an ion implantation method. In this manner, an n-type semiconductor region ER is formed in the first main surface SF1 of the semiconductor substrate SB. The semiconductor region ER has a predetermined depth from the first main surface SF1. A depth of the semiconductor region ER is shallower than a depth of the semiconductor region CHR. The semiconductor region ER configures a diffusion layer of an emitter region. An n-type impurity concentration of the semiconductor region ER is higher than an n-type impurity concentration of the semiconductor region CHR.

Subsequently, an interlayer insulating film IL is formed on the first main surface SF1 of the semiconductor substrate SB. The interlayer insulating film IL is mainly made of, for example, a silicon oxide film, and is formed by, for example, a CVD method or others. Subsequently, by a photolithography technique and a dry etching method, a plurality of contact holes (connection holes) CH each penetrating the interlayer insulating film IL to expose a part of each of the gate electrode GE and the first main surface SF1 of the semiconductor substrate SB are formed. Note that FIG. 6 does not show the contact hole CH and others immediately above the gate electrode GE. The contact hole CH in the element formation region 1A penetrates the semiconductor region ER and reaches the semiconductor region CHR. Similarly, the contact hole CH in the element-isolation formation region 1B reaches the semiconductor region CHR.

Figure 7:
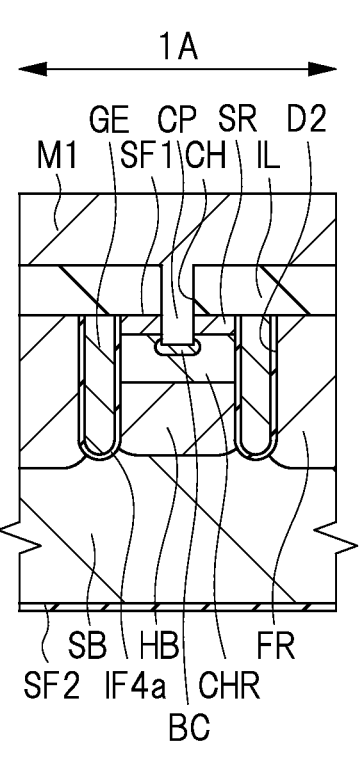
FIG. 7 is a cross-sectional view in a manufacturing step of the semiconductor device, continued from FIG. 6.
Figure 7:
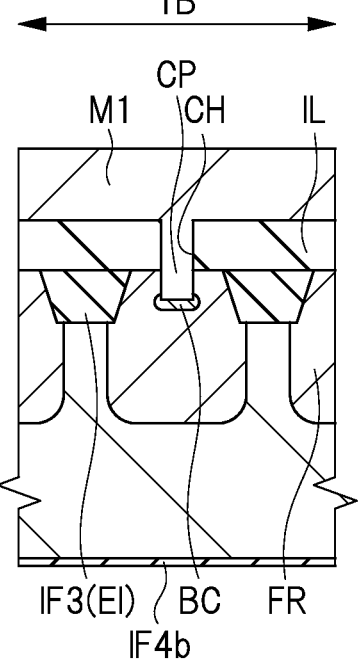

Next, as shown in FIG. 7, while the interlayer insulating film IL is used as an ion-implantation block mask, the first main surface SF1 of the semiconductor substrate SB is doped with p-type impurities (such as boron (B)) by an ion implantation method. In this manner, a p-type semiconductor region BC is formed inside a portion of the semiconductor substrate SB exposed from the bottom surfaces of the contact holes CH in the element formation region 1A and the element-isolation formation region 1B. A depth of the semiconductor region BC is shallower than, for example, a depth of the semiconductor region CHR. A p-type impurity concentration of the semiconductor region BC is higher than a p-type impurity concentration of the semiconductor region CHR.

Subsequently, a contact plug (conductive connecting portion) CP is formed inside each contact hole CH. Specifically, by a sputtering method or others, a tungsten (W) film is deposited on the first main surface SF1 of the semiconductor substrate SB to be buried inside the contact hole CH. Then, the tungsten film formed outside the contact hole CH is removed by a Chemical Mechanical Polishing (CMP) method or others, and, as a result, the contact plug CP made of the tungsten film remaining inside the contact hole CH is formed. The contact plug CP shown in the element formation region 1A of FIG. 7 is electrically connected to the semiconductor region ER. The contact plug CP is electrically connected to the semiconductor region (channel formation region) CHR via the semiconductor region BC. The contact plug CP in the element-isolation formation region 1B is electrically connected to the semiconductor region (channel formation region) CHR via the semiconductor region BC.

Subsequently, a wiring (wiring layer) M1 is formed on the interlayer insulating film IL and on the contact plug CP. Specifically, for example, a barrier conductor film made of Ti (titanium), TiN (titanium nitride), TiW (tungsten titanium) or others and a main conductor film made of AlCu (copper aluminum) or others are sequentially deposited on the interlayer insulating film IL and on the contact plug CP by a sputtering method or others. In this manner, the wiring M1 made of the barrier conductor film and the main conductor film is formed. The wiring M1 is connected to each of the plurality of contact plugs CP. In this step, a metal film (not illustrated) covering an outer circumferential surface of the semiconductor wafer is formed. Subsequently, by a wet etching method, the metal film covering an outer circumferential surface of the semiconductor wafer is removed. In this step, a part of the surface of the insulating film IF4*b* covering the second main surface SF2 of the semiconductor substrate SB is also removed, and, as a result, the insulating film IF4*b* is thinned. In this manner, the thickness of the insulating film IF4*b* covering the second main surface SF2 of the semiconductor substrate SB becomes, for example, equal to or larger than 10 nm and equal to or smaller than nm. In this case, the thickness of the insulating film IF4*b* is, for example, 30 nm.

Figure 8:
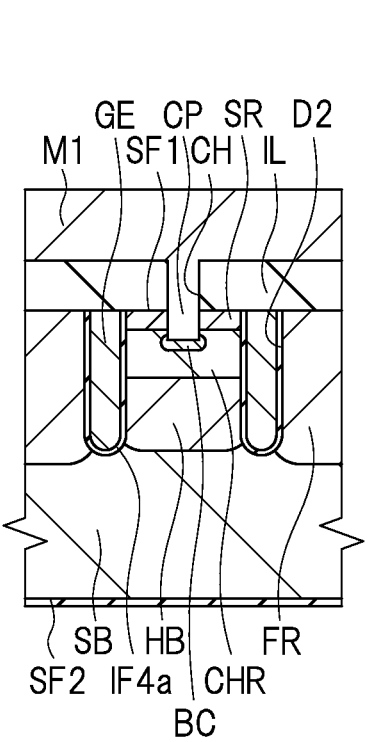
FIG. 8 is a cross-sectional view in a manufacturing step of the semiconductor device, continued from FIG. 7.
Figure 8:
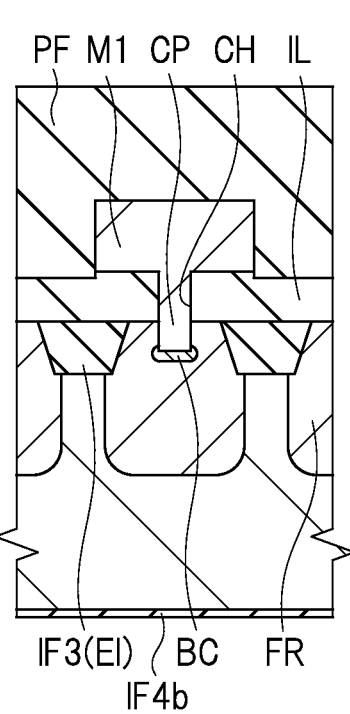

Next, as shown in FIG. 8, by a photolithography technique and a dry etching method, a part of the wiring M1 is removed to expose the interlayer insulating film IL. In other words, the wiring M1 is patterned. Subsequently, a passivation film PF made of, for example, polyimide or others is formed on the first main surface SF1 of the semiconductor substrate SB. Subsequently, by performing exposure and development, the passivation film PF is patterned. The passivation film PF includes an opening exposing a part of the wiring M1.

Figure 9:
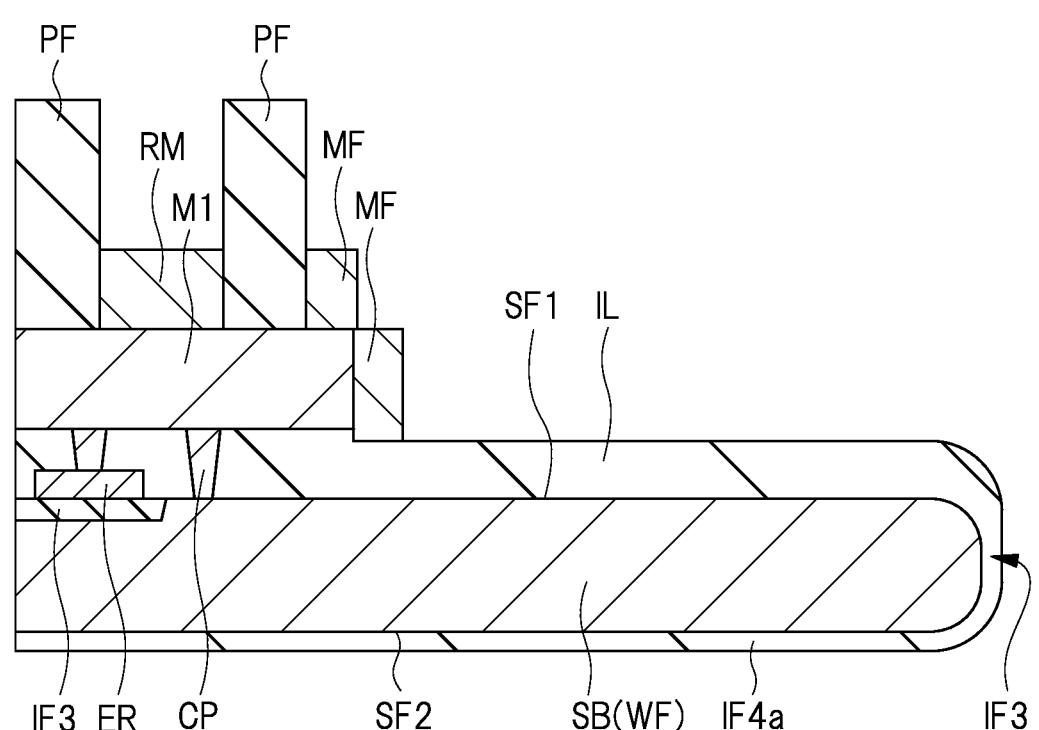
FIG. 9 is a cross-sectional view in a manufacturing step of the semiconductor device, continued from FIG. 8.

Next, as shown in FIG. 9, a redistribution-wiring step is performed. In other words, a redistribution wiring RM is formed on a part of the wiring M1 exposed from the passivation film PF. FIG. 9 shows a cross-sectional view including an end of the semiconductor wafer. A thickness of the redistribution wiring RM is smaller than that of the passivation film PF. In this case, the metal film MF is also formed on a portion of the upper and side surfaces of the wiring M1 exposed from the passivation film PF, the portion being in a surface of the end of the wiring M1. In this redistribution-wiring step, for example, a nickel (Ni) film and a gold (Au) film are sequentially formed by a plating method, and, as a result, the redistribution wiring RM including a stacking structure made of the nickel film and the gold film is formed. In this case, the thickness of the insulating film IF4b covering the second main surface SF2 of the semiconductor substrate SB is, for example, equal to or larger than 10 nm and equal to or smaller than 30 nm.

Figure 10:
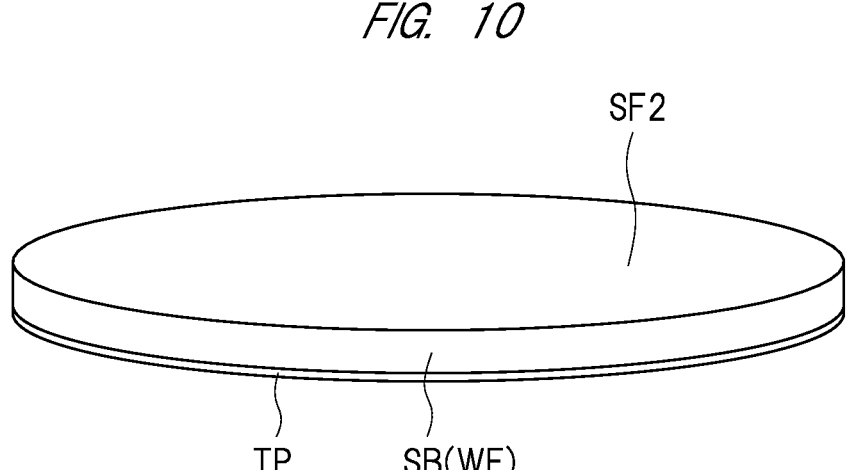
FIG. 10 is an oblique view in a manufacturing step of the semiconductor device, continued from FIG. 9.

Next, as shown in FIG. 10, a protection tape TP for covering the first main surface SF1 of the semiconductor wafer WF is pasted, and then, the semiconductor wafer WF is flipped upside down. In other words, this is flipped upside down so that the first main surface SF1 covered with the protection tape TP faces the down side.

Figure 11:
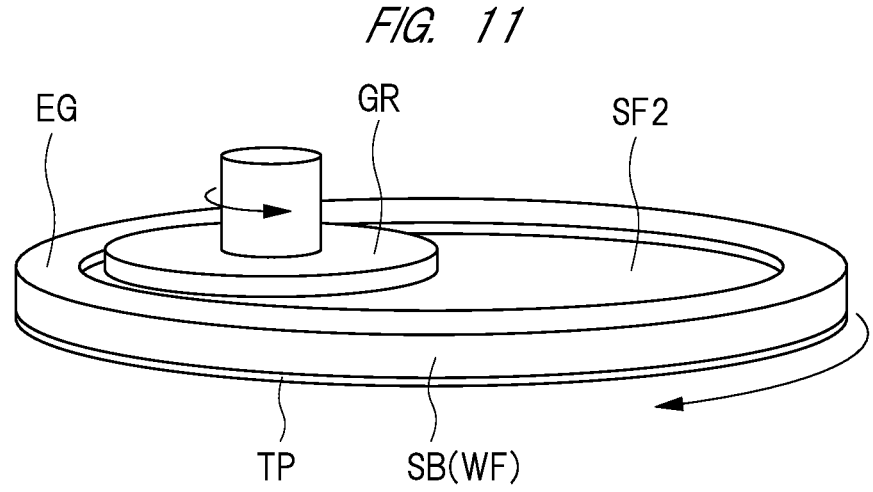
FIG. 11 is an oblique view in a manufacturing step of the semiconductor device, continued from FIG. 10.

Next, as shown in FIG. 11, the second main surface SF2 of the semiconductor wafer WF and the silicon oxide film formed on the second main surface SF2 are ground. The grinding step is performed in a state in which the thickness of the silicon oxide film formed on the second main surface SF2 is equal to or larger than 10 nm and equal to or smaller than 30 nm. The grinding is performed from the second main surface SF2 side of the semiconductor wafer WF to thin the semiconductor substrate SB. In this manner, the thickness of the semiconductor substrate becomes, for example, roughly equal to or larger than 40 μm and equal to or smaller than 60 μm. Since the protection tape TP is pasted on the front surface side of the semiconductor wafer WF, the semiconductor element or others formed on the semiconductor substrate SB is not broken.

In this case, an edge portion EG (reinforcing portion, ring-shaped reinforcing portion, annular convex portion for reinforcement) of the outermost circumference of the semiconductor wafer WF is left, and only the second main surface SF2 of the semiconductor substrate SB inside it is ground to be thinned. A width of the edge portion EG not ground is, for example, roughly equal to or larger than 2.5 mm and equal to or smaller than 3 mm. In this case, the grinding is performed by bringing a grind blade of a rotating grindstone GR to be in contact with the second main surface SF2 of the semiconductor wafer WF while rotating the semiconductor wafer WF.

Then, although not illustrated, spin etching is performed to the second main surface SF2 of the semiconductor substrate SB. First, the semiconductor wafer WF is sucked in vacuum on or mechanically fixed to, for example, a spin head having a rotating mechanism. Then, etchant is flown from a nozzle provided above the semiconductor wafer WF to the second main surface SF2 of the semiconductor wafer WF, and, as a result, the second main surface SF2 of the semiconductor wafer WF is cleansed.

Figure 12:
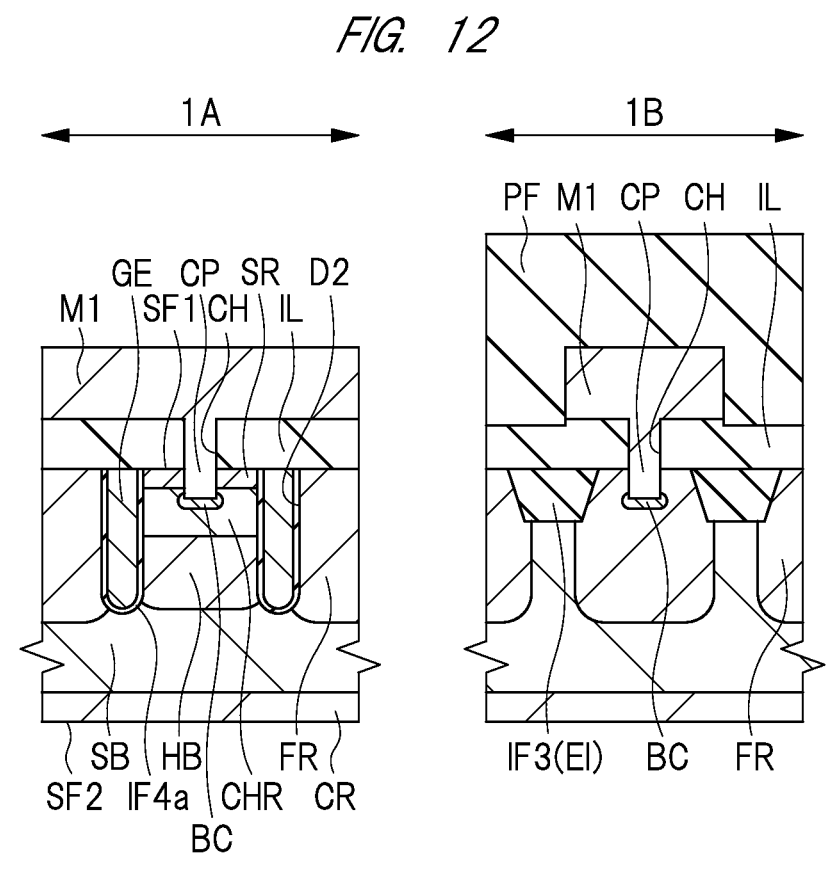

Next, as shown in FIG. 12, the second main surface SF2 of the semiconductor substrate SB is doped with n-type impurities (such as arsenic (As)) by an ion implantation method. In this manner, an n-type semiconductor region CR is formed in the second main surface SF2 of the semiconductor substrate SB. In this manner, a trench-type IGBT is formed in the element formation region 1A. The semiconductor region CR configures a collector region of the IGBT. In other words, the IGBT includes at least the gate electrode GE, the semiconductor region ER to be the emitter region, the semiconductor region CR to be the collector region and the semiconductor region CHR to be the channel formation region.

Figure 13:
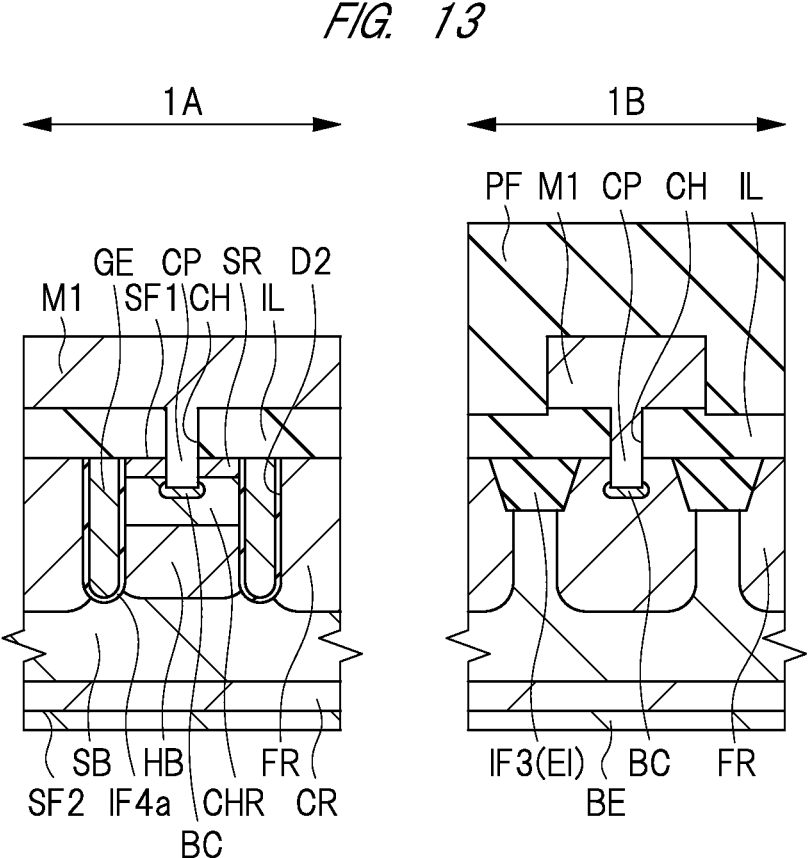
FIG. 13 is a cross-sectional view in a manufacturing step of the semiconductor device, continued from FIG. 12.

Next, as shown in FIG. 13, a back-surface electrode (collector electrode) BE covering the second main surface SF2 of the semiconductor substrate SB is formed. Specifically, on the second main surface SF2 of the semiconductor substrate SB, a stacked metal film made of Al, Ti, Ni Au or others is formed. In this manner, the back-surface electrode BE made of this stacked metal film is formed.

Figure 14:
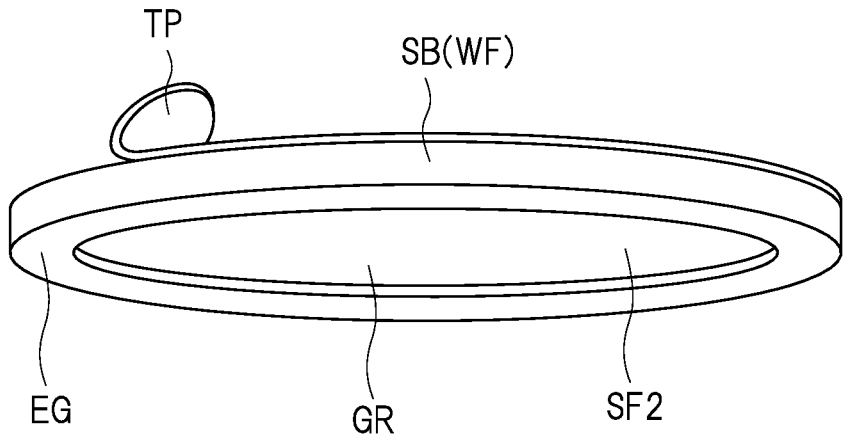
FIG. 14 is an oblique view in a manufacturing step of the semiconductor device, continued from FIG. 13.

Next, as shown in FIG. 14, the protection tape TP is peeled off from the semiconductor wafer WF.

Although illustration of subsequent steps are omitted, dicing is performed to the semiconductor wafer WF to dice the semiconductor wafer WF. In this manner, a plurality of semiconductor chips are provided from the semiconductor wafer. The semiconductor device of the present embodiment is substantially completed by the above-described steps.

Effects of Present Embodiment

In the method of manufacturing the semiconductor device according to the present embodiment, the back-surface grinding is performed to the semiconductor substrate in order to thin the semiconductor substrate. In this case, the redistribution-wiring step is performed before this grinding step. However, if the silicon of the second main surface (back surface) of the semiconductor substrate is exposed in the redistribution-wiring step, foreign substances are generated (precipitated) on the second main surface by the reaction in the plating process since the second main surface has the conductivity.

As a method of preventing the generation of the foreign substances, it is conceivable that the redistribution-wiring step is performed in a state in which the second main surface is covered with the protection tape. However, in a case of addition of such a step of forming the protection tape on the second main surface (particularly a case of newly introducing a machine for the pasting of the protection tape), a manufacturing cost of the semiconductor device increases. Also, a step of peeling off the protection tape is also necessary since the grinding step on the second main surface, the ion implantation onto the second main surface and the back-surface electrode forming step as explained with reference to FIGS. 11 to 13 are performed after the redistribution-wiring step.

Accordingly, in the present embodiment, the redistribution-wiring step is performed in a state in which the second main surface SF2 of the semiconductor substrate SB is covered with the insulating film IF4b. In other words, the second main surface SF2 is protected by the insulating film IF4b that is the non-conductor, and therefore, the foreign substances are prevented from being generated on the second main surface SF2 at the time of the plating process. In this case, if the thickness of the insulating film IF4b is smaller than 10 nm, there is a risk that is failure to prevent the generation of the foreign substances, and therefore, the thickness of the insulating film IF4b needs to be equal to or larger than 10 nm. In this case, the insulating film IF4b formed by the oxidation step of oxidizing even the back surface after the formation of the trench D2 of the IGBT is used.

In this case, in the semiconductor wafer having the diameter that is larger than 8 inches (such as 300 mm), the second main surface SF2 of the semiconductor wafer is the mirror surface (smooth surface), and the surface of the insulating film IF4b covering the second main surface SF2 is also the mirror surface (smooth surface) in a point of view of securing the flatness. If the grinding step is performed on such a semiconductor wafer in the state with the relative thick insulating film IF4b, the rotation of the grind blade (grindstone) stops soon, and the grinding may not advance. In other words, after the insulating film IF4b is slightly ground, the grind blade slips on the surface of the insulating film IF4b, and the grinding may not advance. In this case, if a rotation speed of the grind blade is increased in order to make the grinding advance, the grinding machine may be stopped by overcurrent. Therefore, if the second main surface SF2 of the semiconductor wafer is covered with the relatively thick insulating film IF4b having the mirror surface, this becomes a cause of the reduction of the reliability of the method of manufacturing the semiconductor device.

Accordingly, in the present embodiment, this grinding step is performed in the state in which the thickness of the insulating film IF4b is equal to or larger than 10 nm and equal to or smaller than 30 nm. When the thickness of the insulating film IF4b is equal to or smaller than 30 nm as described above, the insulating film IF4b is thin, and therefore, the insulating film IF4b can be easily removed by the grinding, and the semiconductor substrate SB can be thinned by the grinding.

In this manner, the generation of the foreign substances in the redistribution-wiring step can be prevented, and the semiconductor substrate can be thinned by the back-surface grinding. Therefore, it is unnecessary to form and peel off the protection tape on the back surface of the semiconductor wafer for preventing the generation of the foreign substances. Therefore, the reliability of the method of manufacturing the semiconductor device can be improved.

In the present embodiment, it is important to perform the grinding step on the back surface of the semiconductor substrate SB in the state in which the thickness of the insulating film IF4b is equal to or larger than 10 nm and equal to or smaller than 30 nm. In the present embodiment, the thickness of the insulating film IF4b is thinned by the plurality of steps. However, the present invention is not limited to this. The thickness of the insulating film IF4b may be made to be equal to or larger than 10 nm and equal to or smaller than 30 nm by single step. The thickness of the insulating film IF4b removed in each step for thinning the thickness of the insulating film IF4b is not particularly limited, either.

Second Embodiment

As explained in the method of manufacturing the semiconductor device of the first embodiment, the thickness of the insulating film covering the back surface of the semiconductor wafer is gradually reduced by the step of removing the semiconductor layer formed on the back surface of the semiconductor wafer, the step of removing the metal film formed on the outer circumferential surface of the semiconductor wafer and others. Accordingly, a devisal for preventing the thickness of the insulating film from being equal to or smaller than 10 nm immediately before the redistribution-wiring step will be explained below with reference to FIGS. 15 to 19. Each of FIGS. 15 to 19 is a cross-sectional view showing the semiconductor device in the manufacturing step as similar to the step explained in each of FIGS. 1 to 6, and shows a portion including the edge portion of the semiconductor wafer.

Figure 15:
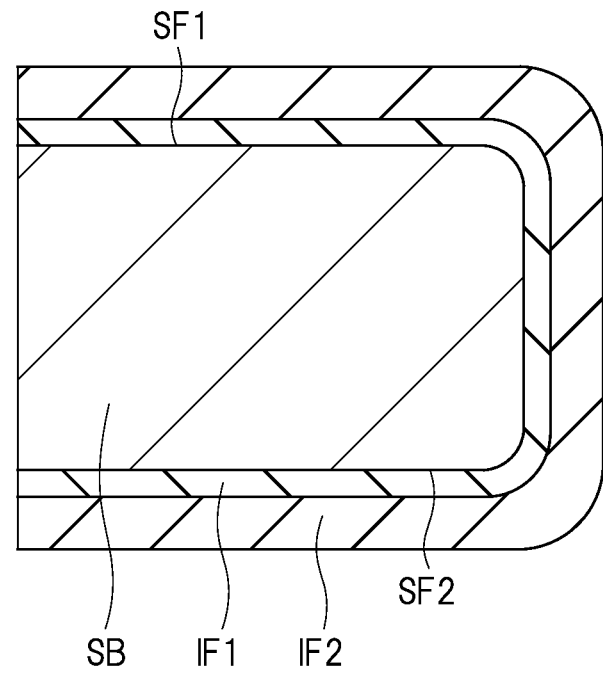
FIG. 15 is a cross-sectional view in a manufacturing step of a semiconductor device according to a second embodiment.

First, as shown in FIG. 15, the step of preparing the semiconductor substrate SB and the step of forming the insulating films IF1 and IF2 explained in FIG. 1 are performed. However, the formation of the trench D1 explained in FIG. 1 is not performed yet at this stage. At this stage, the edge portion of the semiconductor wafer WF and the second main surface SF2 of the semiconductor substrate SB are also covered with the insulating films IF1 and IF2. Even in the first embodiment, the second main surface SF2 of the semiconductor substrate SB is covered with the insulating films IF1 and IF2, but its illustration is omitted. In the first embodiment, the insulating films IF1 and IF2 are removed before the formation of the insulating films IF4a and IF4b. The thickness of the insulating film IF1 is, for example, 30 nm. The thickness of the insulating film IF2 is, for example, 150 nm.

Figure 16:
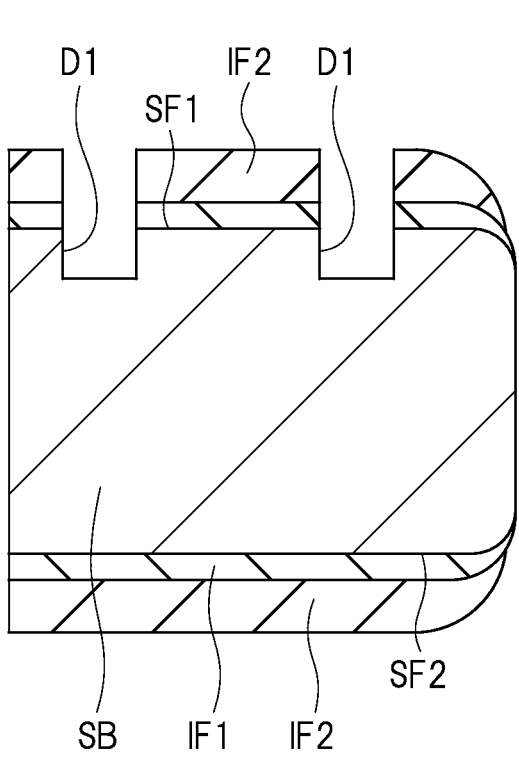
FIG. 16 is a cross-sectional view in a manufacturing step of the semiconductor device, continued from FIG. 15.

Next, as shown in FIG. 16, the trench D1 is formed by the steps explained with reference to FIG. 1. Subsequently, the insulating films IF1 and IF2 covering the outer circumferential surface of the semiconductor wafer WF are removed.

Figure 17:
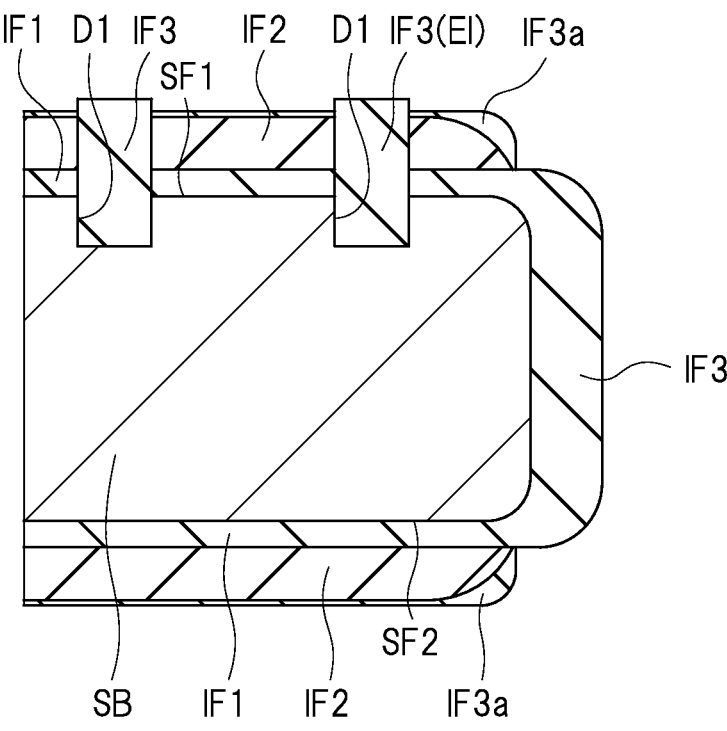
FIG. 17 is a cross-sectional view in a manufacturing step of the semiconductor device, continued from FIG. 16.

Next, as shown in FIG. 17, the insulating film IF3 is formed as explained with reference to FIG. 2. At this stage, an insulating film IF3 is also formed on the exposed outer circumferential surface of the semiconductor wafer WF. Although not illustrated in FIG. 2, in the oxidation step for forming the insulating film IF3, an insulating film IF3a is also formed on the insulating film IF2 made of the silicon nitride film. This manner is the same between the first main surface SF1 side and the second main surface SF2 side of the semiconductor substrate SB. When the insulating film IF3 is formed on the outer circumferential surface of the semiconductor wafer WF, the generation of the foreign substances on the outer circumferential surface of the semiconductor wafer WF can be prevented in the later redistribution-wiring step.

Figure 18:
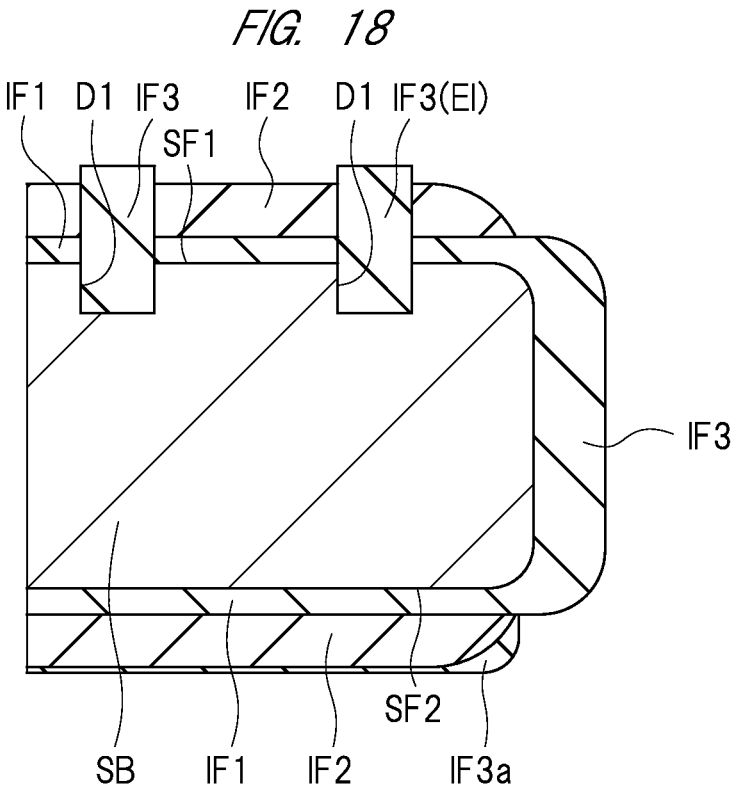
FIG. 18 is a cross-sectional view in a manufacturing step of the semiconductor device, continued from FIG. 17.

Next, as shown in FIG. 18, by wet etching using hydrofluoric acid (HF), the insulating film IF3a covering the insulating film IF2 on the first main surface SF1 side of the semiconductor substrate SB is removed. In this case, the wet etching is performed only on the first main surface SF1 side of the semiconductor substrate SB while using a sheet-fed apparatus. The insulating film IF2 is exposed by removing the insulating film IF3a on the first main surface SF1 while leaving the insulating film IF3a covering the second main surface SF2.

Figure 19:
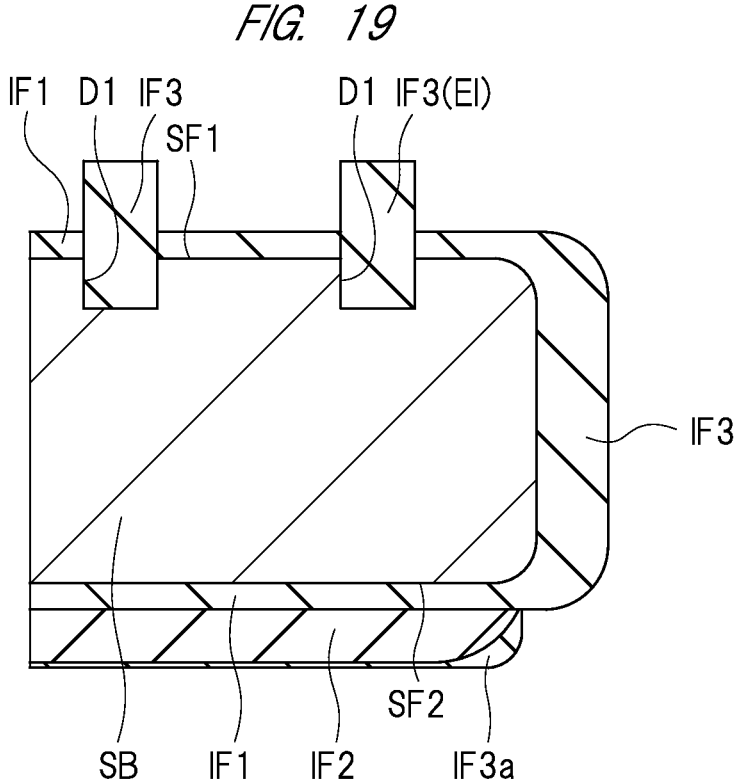
FIG. 19 is a cross-sectional in a manufacturing step of the semiconductor device, continued from FIG. 18.

Next, as shown in FIG. 19, by wet etching using hot phosphoric acid, the exposed insulating film IF2 is removed, and, as a result, the insulating film IF1 on the first main surface SF1 of the semiconductor substrate SB is exposed. In other words, the insulating film IF1 on the first main surface SF1 is exposed by removing the insulating film IF2 on the first main surface SF1 while leaving the insulating film IF2 on the second main surface SF2. This step corresponds to the step of removing the insulating film IF2 as explained with reference to FIG. 3. In this step, the silicon nitride is selectively removed, and therefore, the silicon oxide film is not removed but left. Therefore, the insulating film IF2 being covered with the insulating film IF3a made of the silicon oxide film and being on the second main surface SF2 side of the semiconductor substrate SB is not removed but left. Note that the insulating film IF3 that is the LOCOS oxidation film formed on the first main surface SF1 side of the semiconductor substrate SB is not removed, either, but left. One of main features of the present embodiment is to leave the insulating film IF2 on the second main surface SF2 side of the semiconductor substrate SB so as to prevent the thinning or the entire removal of the insulating film IF1 between the insulating film IF2 and the second main surface SF2 of the semiconductor substrate SB in the subsequent steps.

Next, although not illustrated, as explained with reference to FIG. 3, a step of removing the insulating film IF1 and forming the semiconductor regions FR and HB and the trench D2 are performed. The subsequent steps are performed as similar to the steps with reference to FIGS. 4 to 6. Subsequently, a step of forming the contact plug CP as explained with reference to FIG. 7 is performed. However, since the second main surface SF2 of the semiconductor substrate SB is covered with the insulating films IF1 and IF2, it is also conceivable that the insulating film IF4b shown in FIG. 4 is not formed on the second main surface SF2 side.

The exposed insulating film IF2 is removed by the wet etching using hot phosphorous acid at the moment after the step shown in FIG. 19 and immediately before the step of forming the interlayer insulating film IL shown in FIG. 6. Since the insulating film IF1 on the second main surface SF2 side of the semiconductor substrate SB is covered with the insulating film IF2 until this removal step, this insulating film IF1 is not removed by the step of removing the semiconductor layer and others.

Then, by the steps similar to the steps explained with reference to FIGS. 6 to 14, the semiconductor device of the present embodiment is substantially completed. In the explanation for the manufacturing step with reference to FIG. 7, the step of removing the metal film (not illustrated) formed to cover the outer circumferential surface of the semiconductor wafer WF in the step of forming the wiring M1 has been described. This removal step is the step capable of removing the insulating film IF1 if the insulating film IF1 is exposed on the second main surface SF2 side of the semiconductor substrate SB. If the insulating film IF1 on the second main surface SF2 side is removed to expose the second main surface SF2, the risk that is the generation of the foreign substances on the second main surface SF2 in the redistribution-wiring step may arise. However, in the present embodiment, this insulating film IF1 is protected by the insulating film IF2 until the moment immediately before the formation of the passivation film PF, and therefore, the exposing of the second main surface SF2 due to the reduction in the thickness of this insulating film IF1 can be prevented. In this manner, the insulating film IF1 having the thickness that is equal to or larger than 10 nm and equal to or smaller than 30 nm can be more reliably left on the second main surface SF2. Therefore, in the grinding step explained with reference to FIG. 11, the second main surface SF2 of the semiconductor substrate SB can be easily ground.

In other words, in the present embodiment, since the insulating film IF2 covering the second main surface SF2 of the semiconductor substrate SB is purposely left in the step explained with reference to FIG. 18, the insulating film IF1 covering the second main surface SF2 is prevented from being removed in the manufacturing steps of the semiconductor device. Since this insulating film IF1 is left until the grinding step explained with reference to FIG. 11 as described above, the same effect as that of the first embodiment can be provided.

Third Embodiment

In the present embodiment, the manufacturing steps of the semiconductor device explained with reference to FIGS. 1 to 9 are performed as similar to the first embodiment. In the present embodiment, after the redistribution-wiring step explained with reference to FIG. 9, all the insulating films (such as the insulating film IF4b) covering the second main surface SF2 of the semiconductor substrate SB are removed. In this manner, the second main surface SF2 of the semiconductor substrate SB is exposed. As the step of removing this insulating film, a wet etching method or a dry etching method is conceivable.

Next, the protection tape TP is pasted as explained with reference to FIG. 10. Subsequently, the step explained with reference to FIG. 11 is performed. In this step, the exposed second main surface SF2 of the semiconductor substrate SB is directly ground. The second main surface SF2 that is the silicon surface can be easier to be ground than the smooth surface made of the thick silicon oxide film even if the second main surface SF2 is the mirror surface. Therefore, the reliability of the method of manufacturing the semiconductor device can be improved.

In the present embodiment, since the insulating film covering the second main surface SF2 of the semiconductor substrate SB is removed before the formation of the protection tape TP explained with reference to FIG. 10, the thickness of this insulating film before this removal step may be larger than 30 nm.

In the foregoing, the invention made by the present inventors has been concretely described on the basis of the embodiments. However, it is needless to say that the present invention is not limited to the foregoing embodiments, and various modifications can be made within the scope of the present invention.

For example, the conductivity type of the portion configuring the IGBT described in the first to third embodiments may be changed. Alternatively, the element formed in the element formation region 1A may be not the IGBT but any element such as a power semiconductor, a MOSFET (Metal Oxide Semiconductor Field Effect Transistor, MOS-type field effect transistor) or a diode other than the IGBT. This element is not limited to the vertical-type semiconductor element but may be a planar-type element having the components only on the first main surface side of the semiconductor substrate.

What is claimed is:

1. A method of manufacturing a semiconductor device, the method comprising:

(a) preparing a semiconductor substrate having a first main surface and a second main surface opposite to the first main surface;

(b1) forming a silicon oxide film covering each of the first main surface and the second main surface;

(b2) after the (b1), forming a silicon nitride film covering each of the first main surface and the second main surface;

(b3) forming an element isolation region on the first main surface exposed from the silicon oxide film and the silicon nitride film;

(b4) after the (b3), removing the silicon nitride film on the first main surface while leaving the silicon nitride film on the second main surface, thereby exposing the silicon oxide film on the first main surface;

(c) after the (b4), forming a wiring on the first main surface;

(d) forming a redistribution wiring on the wiring by using a plating method; and (e) after the (d), grinding the silicon oxide film on the second main surface and grinding the second main surface, wherein the (e) is performed in a state in which a thickness of the silicon oxide film positioned on the second main surface is equal to or larger than 10 nm and equal to or smaller than 30 nm.

2. The method according to claim 1, comprising:

(c1) after the (b), removing the silicon nitride film on the second main surface; and (c2) after the (c1) and before the (c), forming an interlayer insulating film on the first main surface, wherein, in the (c), the wiring is formed on the interlayer insulating film, and wherein, in the (d), the redistribution wiring is formed on a part of the wiring.

3. The method according to claim 1, wherein the (b) includes:

(b5) forming a trench in the first main surface;

(b6) forming the silicon oxide film by oxidation of an inner surface of the trench, the first main surface and the second main surface; and (b7) forming a gate electrode inside the trench, wherein the silicon oxide film inside the trench configures a gate insulating film.

4. A method of manufacturing a semiconductor device, the method comprising:

(a) preparing a semiconductor substrate having a first main surface and a second main surface opposite to the first main surface;

(b1) forming a silicon oxide film covering each of the first main surface and the second main surface;

(b2) after the (b1), forming a silicon nitride film covering each of the first main surface and the second main surface;

(b3) forming an element isolation region on the first main surface exposed from the silicon oxide film and the silicon nitride film;

(b4) after the (b3), removing the silicon nitride film on the first main surface while leaving the silicon nitride film on the second main surface, thereby exposing the silicon oxide film on the first main surface;

(c) after the (b4), forming a wiring on the first main surface;

(d) forming a redistribution wiring on the wiring by using a plating method;

(e) after the (d), removing the silicon oxide film on the second main surface, thereby exposing the second main surface;

(f) after the (e), covering the first main surface with a protection tape;

(g) after the (f), grinding the second main surface; and (h) after the (g), peeling off the protection tape.

* * * * *